US009301419B1

(12) United States Patent
Tsai et al.

(10) Patent No.: US 9,301,419 B1
(45) Date of Patent: Mar. 29, 2016

(54) ASSEMBLY STRUCTURE FOR SERVER HARD DISK BACK PANEL

(71) Applicant: AIC INC., Taoyuan Hsien (TW)

(72) Inventors: Kun-Sheng Tsai, Taoyuan Hsien (TW); Wei-Shih Wu, Taoyuan Hsien (TW); Yong-Cong Chen, Taoyuan Hsien (TW)

(73) Assignee: AIC INC., Taoyuan Hsien (TW)

( * ) Notice: Subject to any disclaimer, the term of this patent is extended or adjusted under 35 U.S.C. 154(b) by 0 days.

(21) Appl. No.: 14/578,590

(22) Filed: Dec. 22, 2014

(51) Int. Cl.
*G06F 1/18* (2006.01)
*H05K 7/14* (2006.01)
*H05K 7/18* (2006.01)
*A47B 57/00* (2006.01)

(52) U.S. Cl.
CPC .............. *H05K 7/1438* (2013.01); *G06F 1/187* (2013.01); *H05K 7/1489* (2013.01); *H05K 7/183* (2013.01); *A47B 57/00* (2013.01); *G06F 1/184* (2013.01)

(58) Field of Classification Search
CPC ......... G06F 1/187; G06F 1/184; A47B 57/40; A47B 57/00; A47B 57/50
USPC ............. 361/679.33, 679.37, 679.38, 679.39, 361/679.43; 211/26, 57.1, 59.1; 174/520, 174/17 R; 248/220.22, 918; 312/223.1
See application file for complete search history.

(56) References Cited

U.S. PATENT DOCUMENTS

| 3,905,484 A * | 9/1975 | Dean | A47B 57/58 108/60 |
| 5,287,974 A * | 2/1994 | Buday | A47B 57/58 211/175 |
| 2007/0144983 A1 * | 6/2007 | Fan | H05K 7/1424 211/26 |
| 2009/0040744 A1 * | 2/2009 | Tsai | G11B 33/128 361/825 |
| 2010/0002369 A1 * | 1/2010 | Lee | G06F 1/187 361/679.33 |
| 2011/0103001 A1 * | 5/2011 | Chen | G11B 33/128 361/679.39 |
| 2011/0155871 A1 * | 6/2011 | Li | G06F 1/187 248/201 |
| 2012/0243178 A1 * | 9/2012 | Zhang | G06F 1/187 361/695 |
| 2013/0009529 A1 * | 1/2013 | Zhu | G06F 1/187 312/223.2 |
| 2013/0258620 A1 | 10/2013 | Qiu et al. | |
| 2015/0003005 A1 * | 1/2015 | Chen | G06F 1/187 361/679.33 |

OTHER PUBLICATIONS

Office Action dated Jul. 2, 2015 of the corresponding Russian utility model application.

* cited by examiner

*Primary Examiner* — Adrian S Wilson
*Assistant Examiner* — Abhishek Rathod
(74) *Attorney, Agent, or Firm* — Chun-Ming Shih; HDLS IPR Services (57) ABSTRACT

An assembly structure for a server hard disk back panel includes a server chassis; a plurality of hard disk frames disposed inside the server chassis; and a back panel disposed between the server chassis and the hard disk frame. A hook is disposed, corresponding to the back panel, on a side edge of each of the two side portions of each hard disk frame. The hooks of any two adjacent hard disk frames are disposed adjacent to each other correspondingly. The back panel includes a plurality of hook holes, and a respective one of the hook holes is corresponding to each two adjacent hooks. Each of the hook holes includes two contact edges corresponding to each other at two sides and includes a hook edge between the two contact edges.

8 Claims, 7 Drawing Sheets

ASSEMBLY STRUCTURE FOR SERVER HARD DISK BACK PANEL

BACKGROUND

1. Technical Field

The present invention relates to a server and, in particular, to an assembly structure for a server hard disk back panel.

2. Related Art

Conventional servers are often equipped with a plurality of hard disks. The hard disks are disposed in a server chassis, inserted on a hard disk back panel, and electrically connected to a server system. In this way, the server system has plenty hard disks for use.

The hard disk back panel of the conventional server is fastened to the server chassis by screws and etc., so assembling/disassembling is troublesome and inconvenient, and alignment errors in screw fastening occur easily. Thus, it is difficult to provide an accurate alignment effect for insertion of each hard disk on the hard disk back panel.

In view of the foregoing, the inventor made various studies to improve the above-mentioned problems to realize the improvements, on the basis of which the present invention is accomplished.

BRIEF SUMMARY

It is an object of the present invention to provide an assembly structure for a server hard disk back panel, whereby a hard disk back panel and a hard disk frame are combined together to save screws and other fastening elements, thereby achieving quick assembly/disassembly. At the same time, since the hard disk back panel is directly combined with the hard disk frame, it enables more accurate insertion of each hard disk.

It is another object of the present invention to provide an assembly structure for a server hard disk back panel, whereby the hard disk back panel is securely positioned on the server chassis without screws or other fastening elements while achieving quick assembly/disassembly.

Accordingly, the present invention provides an assembly structure for a server hard disk back panel, which comprises a server chassis, a plurality of hard disk frames, and a back panel. The server chassis includes a bottom plate, two first side plates disposed correspondingly on the bottom plate, and a second side plate disposed between the two first side plates. The hard disk frames are disposed inside the server chassis and are disposed side by side along the second side plate and between the two first side plates. Each of the hard disk frames includes a top portion and a side portion extending downwardly from two sides of the top portion. The back panel is disposed among the second side plate and the hard disk frames. A hook is disposed, corresponding to the back panel, on a side edge of each of the two side portions of each hard disk frame, and the hooks of any two adjacent hard disk frames are disposed adjacent to each other correspondingly. The back panel includes a plurality of hook holes, and a respective one of the hook holes is corresponding to each two adjacent hooks. Each of the hook holes has two contact edges corresponding to each other at two sides and a hook edge between the two contact edges. The hooks of any two adjacent hard disk frames contact against the two contact edges of the corresponding hook hole respectively and together hook on the hook edge of the hook hole.

Accordingly, the present invention provides an assembly structure for a server hard disk back panel, wherein a rotation press member pressing on the back panel is disposed on an inner side of any of the first side plates of the server chassis, and thereby securely positioning the back panel in the server chassis and achieving quick assembly/disassembly of the back panel without screws or other fastening elements.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

In the following, detailed descriptions along with accompanied drawings are given to better explain the features and technical contents of the present invention. However, the following descriptions and the accompanied drawings are for reference and illustration only, and are not intended to limit the scope of the present invention.

Figure 1:
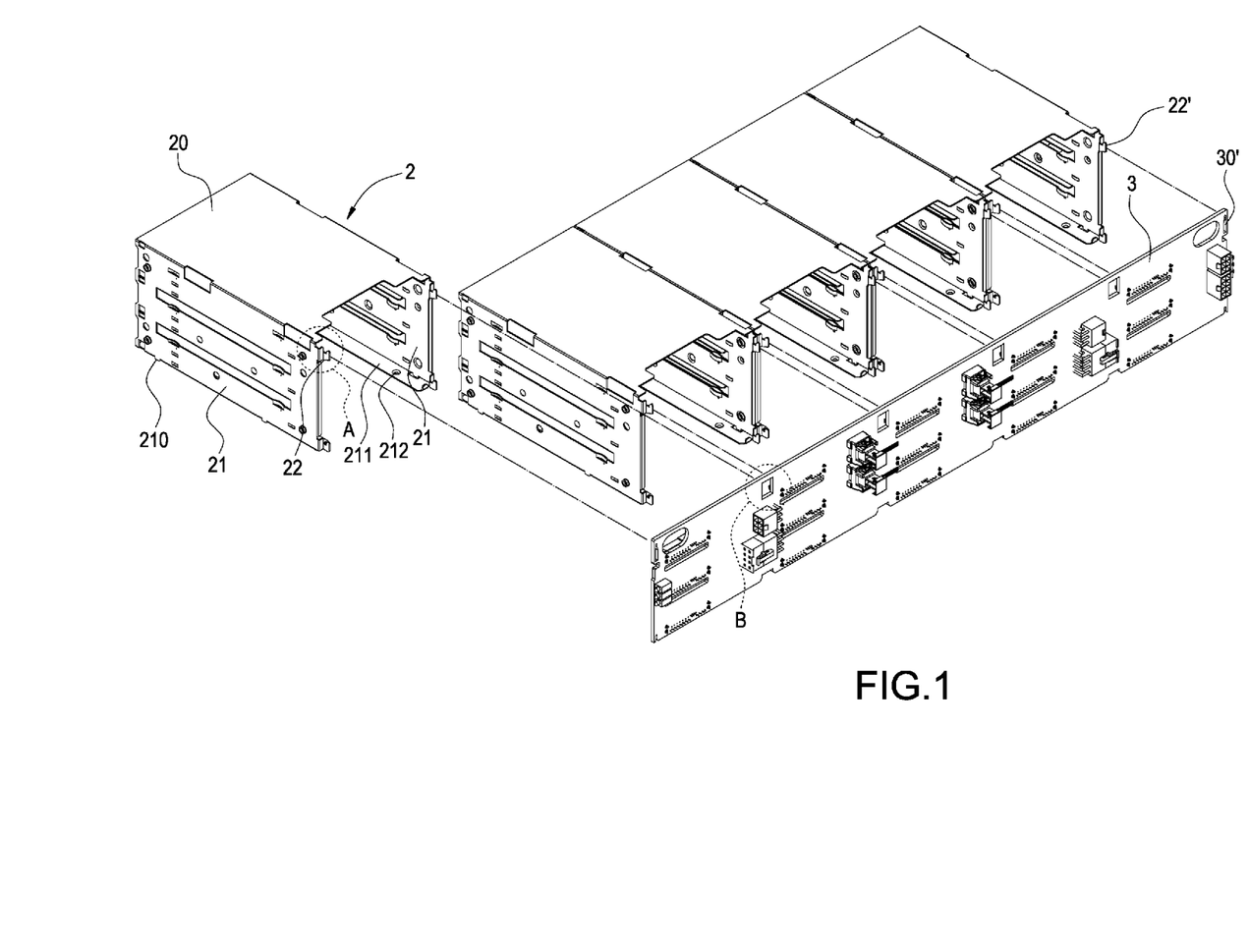
FIG. 1 is a perspective exploded view of a hard disk frame and a back panel of the present invention.
Figure 4:
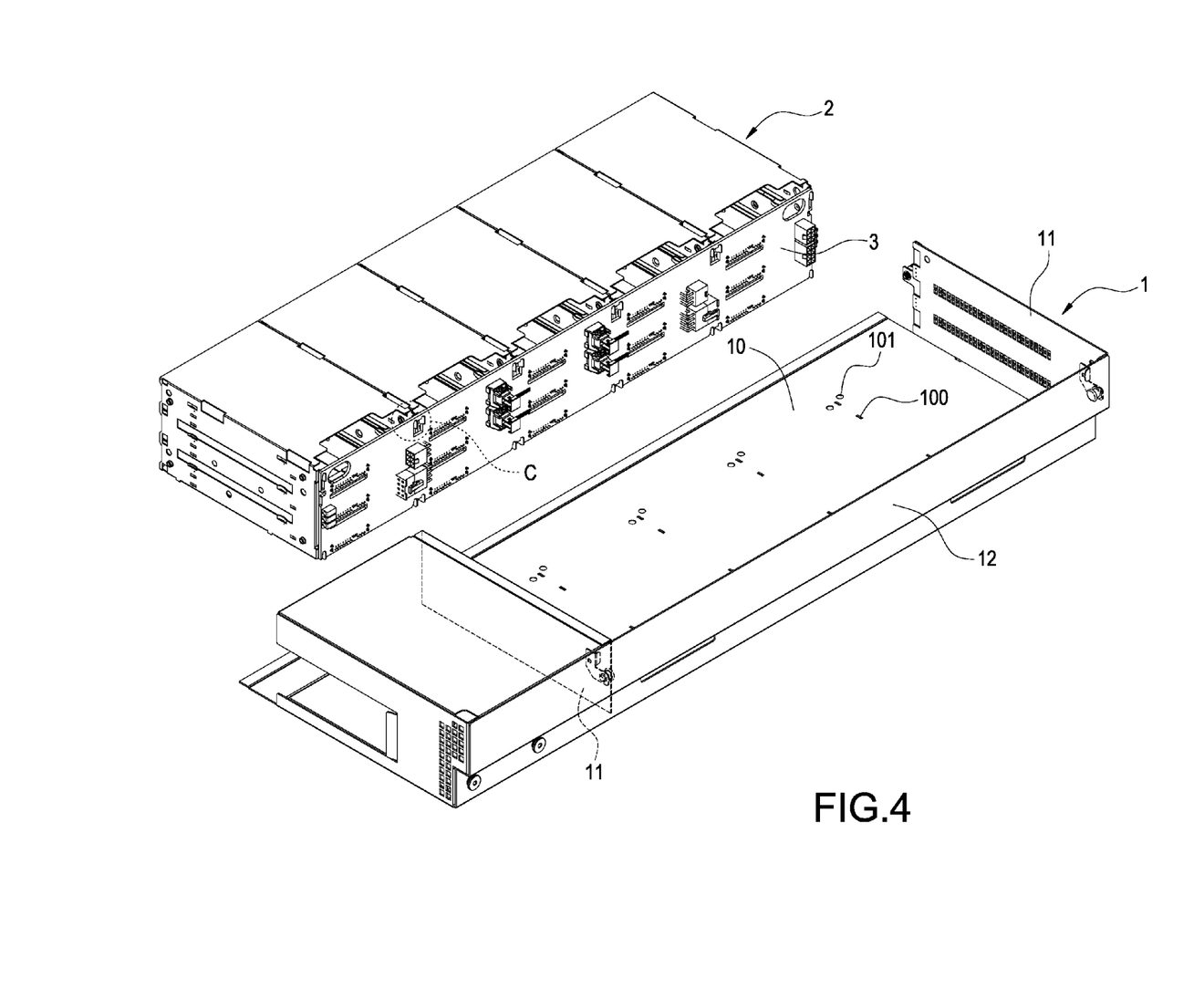
FIG. 4 is a perspective exploded view of a server chassis, the hard disk frame, and the back panel of the present invention.
Figure 6:
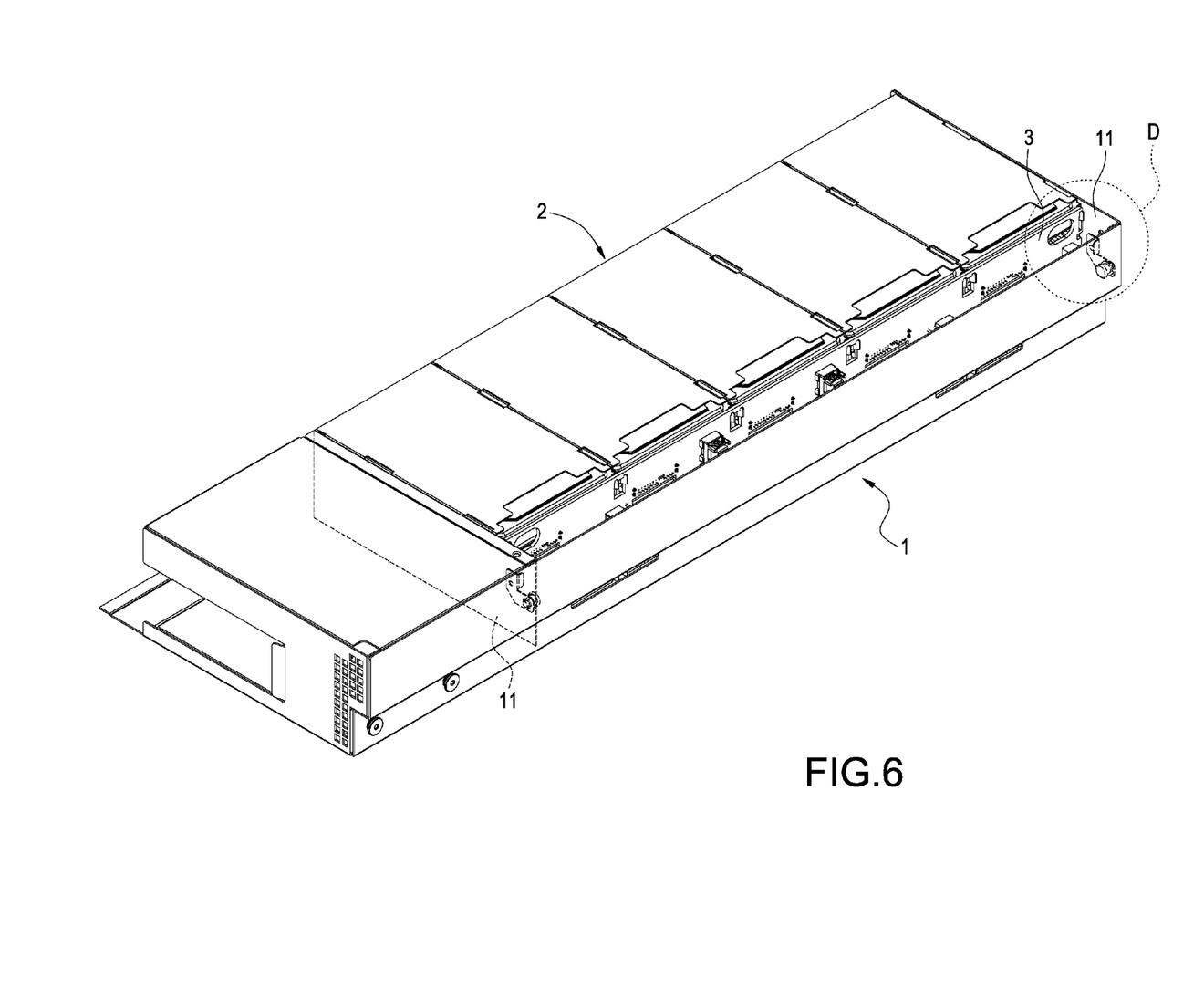
FIG. 6 is a perspective assembled view of the server chassis, the hard disk frame, and the back panel of the present invention.

Please refer to FIGS. 1, 4 and 6 which are a perspective exploded view of a hard disk frame and a back panel of the present invention, a perspective exploded view and a perspective assembled view of a server chassis, the hard disk frame, and the back panel of the present invention. The present invention provides an assembly structure for a server hard disk back panel, comprising a server chassis 1, a plurality of hard disk frames 2, and a back panel 3.

First referring to FIG. 4 and FIG. 6, the server chassis 1 is to be installed into a server cabinet (not illustrated). The server chassis 1 is usually assembled layer by layer in a drawer-type manner. Installing of the server chassis 1 into the server cabinet is not within the scope of the present invention, so detailed descriptions are omitted herein. The server chassis 1 at least includes a bottom plate 10, two first side plates 11 disposed correspondingly on the bottom plate 10, and a second side plate 12 disposed between the two first side plates 11, so that the hard disk frame 2 and the back panel 3 can be installed in the server chassis 1.

Referring to FIGS. 1, 4, and 6, the hard disk frames 2 are disposed side by side along the second side plate 12 of the server chassis 1 and between the two first side plates 11. Each of the hard disk frames 2 is in an inverse-U shape, and includes a top portion 20 and a side portion 21 extending downwardly from two sides of the top portion 20, so that hard disks (not illustrated) can be accommodated in a space formed by the top portion 20 and the two side portions 21. Any two adjacent hard disk frames 2 are adjacent to each other at their corresponding side portions 21. A lower edge of each of the two side portions 21 of each of the hard disk frames 2 includes a plurality of flanges 210, and a plurality of engagement holes 100 are formed corresponding thereto on the bottom plate 10 of the server chassis 1, so that the flange 210 of each of the hard disk frames 2 is engaged and positioned in the engagement hole 100 of the bottom plate 10. A bend portion 211 bent inwardly is disposed at a lower edge of each of the two side portions 21 of each of the hard disk frames 2. Each of the bend portions 211 includes a plurality of upper screw holes 212, and the bottom plate 10 of the server chassis 1 includes a plurality of corresponding lower screw holes 101. Accordingly, when the hard disk frame 2 is disposed on the server chassis 1, the upper screw hole 212 of each bend portion 211 overlaps the corresponding lower screw hole 101. Thus, the hard disk frames 2 can be fastened to the bottom plate 10 of server chassis 1 by screws or other fastening elements (not illustrated).

Figure 2:
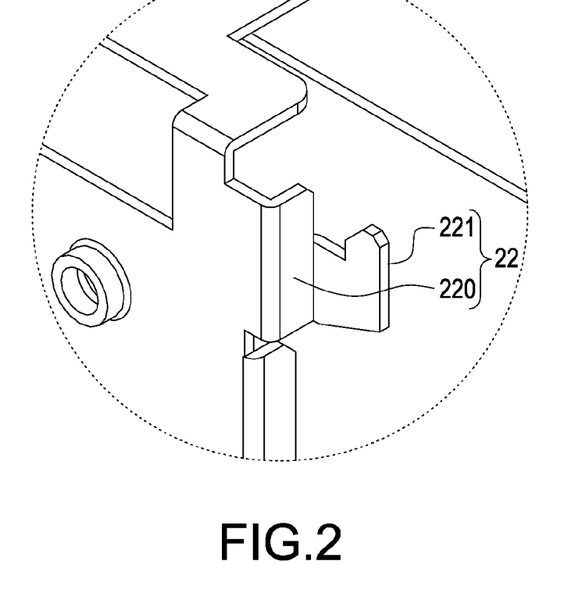
FIG. 2 is a partially enlarged view of part A of FIG. 1.
Figure 3:
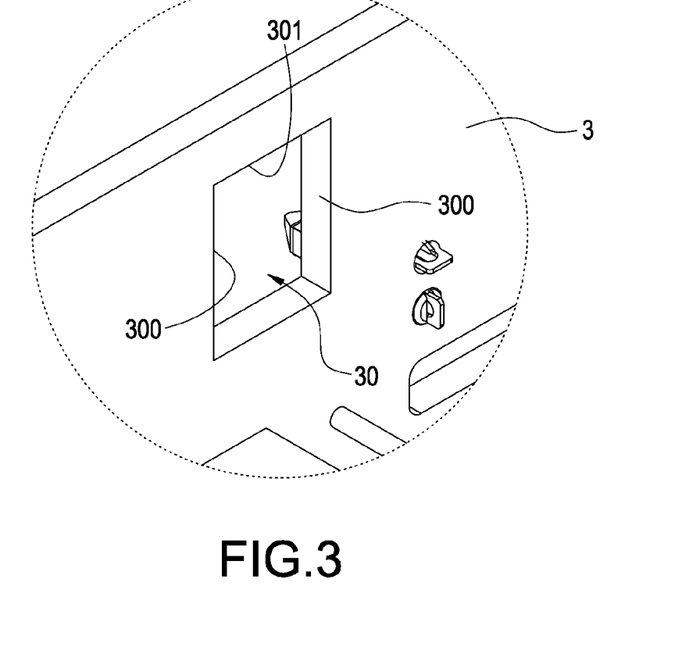
FIG. 3 is a partially enlarged view of part B of FIG. 1.
Figure 5:
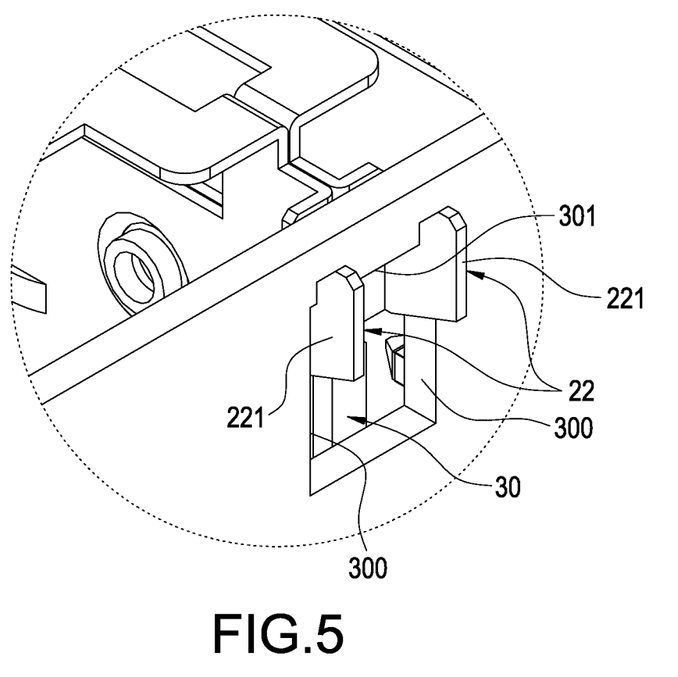
FIG. 5 is a partially enlarged view of part C of FIG. 4.

The back panel 3 is disposed among the second side plate 12 of the server chassis 1 and the hard disk frames 2, and the hard disk in each hard disk frame 2 is inserted on the back panel 3. The present invention utilizes the hard disk frame 2 for fastening thereon of the back panel 3, and utilizes the back panel 3 to arrange and position each of the hard disk frames 2. Referring to FIG. 2, FIG. 3, and FIG. 5, a hook 22 (as shown in the part A of FIG. 1 or FIG. 2) is disposed, corresponding to the back panel 3, on a side edge of each of the two side portions 21 of each hard disk frame 2, and the hooks 22 of any two adjacent hard disk frames 2 are disposed adjacent to each other correspondingly. The back panel 3 includes a plurality of hook holes 30 (as shown in the part B of FIG. 1 or FIG. 3), and a respective one of the hook holes is corresponding to each two adjacent hooks 22, each of the hook holes 30 includes two contact edges 300 corresponding to each other at two sides and a hook edge 301 between the two contact edges 300, and the hooks 22 of any two adjacent hard disk frames 2 contact against the two contact edges 300 of the corresponding hook hole 30 respectively and together hook on the hook edge 301 of the hook hole 30. The two contact edges 300 of the hook hole 30 restrict the hooks 22 of the two adjacent hard disk frames 2 to be in a limited space closely, so that the two adjacent hard disk frames 2 are closely arranged side by side, and the back panel 3 is able to be fastened on the hard disk frames 2. To be specific, each of the hooks 22 includes a bend edge 220 bent inwardly from the side edge of the side portion 21 and includes a hook plate 221 extending from the bend edge 220 toward the back panel 3. The hook plate 221 contacts against any contact edge 300 of the hook hole 30 and hook on the hook edge 301 of the hook hole 30 (as shown in the part C of FIG. 4 or FIG. 5). Furthermore, as shown in FIG. 1, the hook 22' in a left-most position or in a right-most position can be engaged with the hook hole 30' having an elongated shape.

Figure 7:
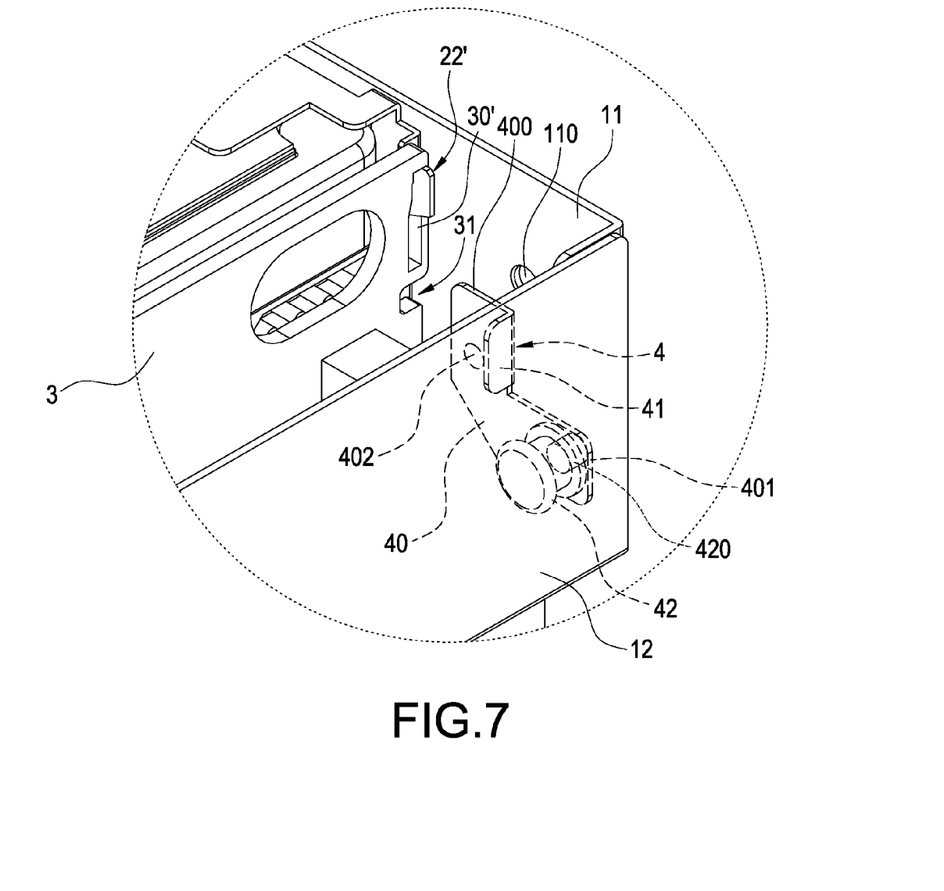
FIG. 7 is a partially enlarged view of part D of FIG. 6.
Figure 8:
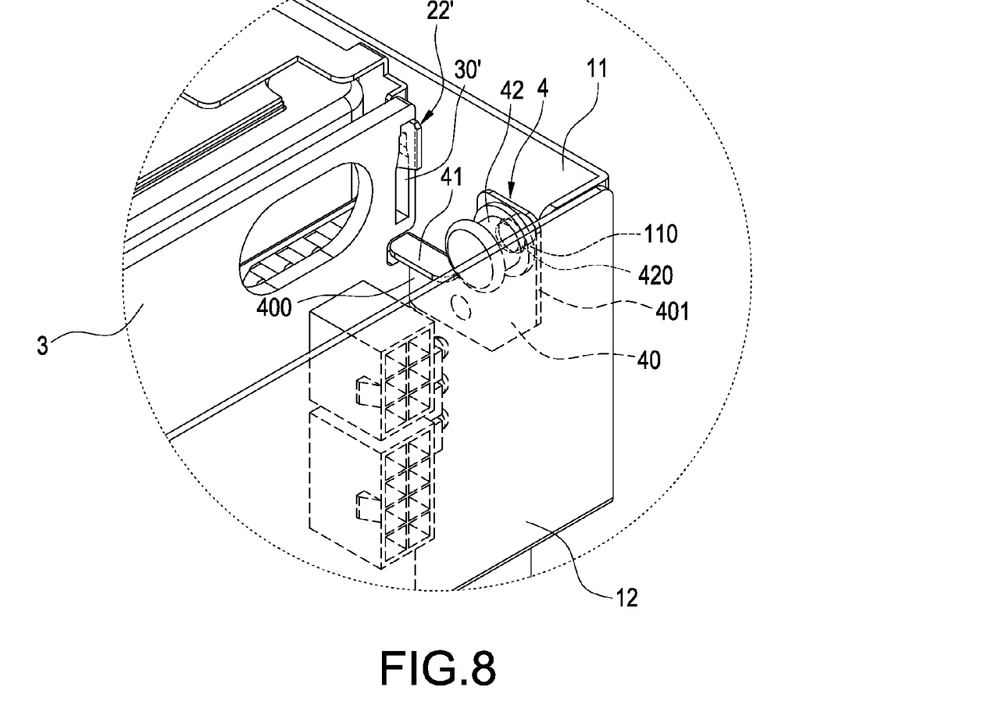
FIG. 8 is a schematic view showing the movement based on FIG. 7.
Figure 9:
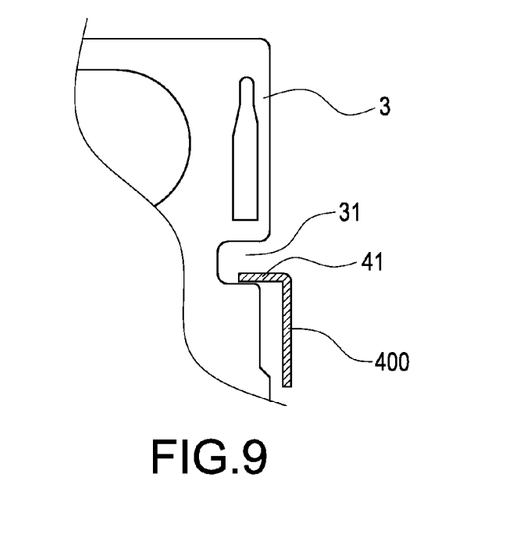
FIG. 9 is a partially sectional view based on FIG. 8.

Referring to FIG. 6 and FIG. 7, in order to securely position the back panel 3 on the server chassis 1, a rotation press member 4 is disposed on an inner side of any of the first side plates 11 of the server chassis 1 and presses on the back panel 3. Referring to the part D of FIG. 6, FIG. 7, and FIG. 8 for more details, the rotation press member 4 includes a plate body 40 in an L shape, one end of the plate body 40 is a press end 400, the other end of the plate body 40 is a fixed end 401, a pivot 402 is disposed between the press end 400 and the fixed end 401 in a manner that enables the plate body 40 to be pivotally disposed on the first side plate 11. The press end 400 includes a press portion 41 bent horizontally. The fixed end 401 is disposed with a resilient pin 42, and the resilient pin 42 includes a protruding pin 420 inserted and positioned in any positioning hole 110 on the first side plate 11. Accordingly, as shown in FIG. 8, when the press end 400 of the plate body 40 of the rotation press member 4 rotates toward the back panel 3, the press portion 41 can press on a press hole 31, cooperative with the press end 400 and formed on a corresponding side edge of the back panel 3, and at the same time the protruding pin 420 of the resilient pin 42 is inserted in the positioning hole 110 on the first side plate 11. Therefore, the back panel 3 is securely positioned in the server chassis 1 by using the rotation press member 4. Meanwhile, the present invention achieves quick assembling/disassembling of the back panel 3 without using screws or other fastening elements.

Therefore, the assembly structure for the server hard disk back panel of the present invention can be carried out based on the above-mentioned constructions.

In summary, the present invention is an extraordinary utility patent product, surely can achieve the anticipated objects and resolve the defects of the conventional techniques. The present invention is novel and non-obvious. Hence, a request to patent the present invention is filed based on the patent laws. Examination is kindly requested, and allowance of the present patent application is solicited to protect the rights of the inventor.

It is to be understood that the above descriptions are merely preferable embodiments of the present invention and not intended to limit the scope of the present invention. Equivalent changes and modifications made in the spirit of the present invention are regarded as falling within the scope of the present invention.

What is claimed is:

1. An assembly structure for a server hard disk back panel, comprising:
    a server chassis including a bottom plate, two first side plates disposed correspondingly on the bottom plate, and a second side plate disposed between the two first side plates;
    a plurality of hard disk frames disposed inside the server chassis and
    disposed side by side along the second side plate and between the two first side plates, each of the hard disk frames including a top portion and a side portion extending downwardly from two sides of the top portion; and
    a back panel disposed among the second side plate and the hard disk frames,
    wherein a hook is disposed, corresponding to the back panel, on a side edge of each of two side portions of each hard disk frame; the hooks of any two adjacent hard disk frames are disposed adjacent to each other correspondingly; the back panel includes a plurality of hook holes, and a respective one of the hook holes is corresponding to each two adjacent hooks; each of the hook holes includes two contact edges corresponding to each other at two sides and a hook edge between the two contact edges; and the hooks of any two adjacent hard disk frames contact against the two contact edges of the corresponding hook hole respectively and together hook on the hook edge of the hook hole;
    wherein a rotation press member is disposed on an inner side of any of the first side plates of the server chassis and presses on the back panel; and wherein the rotation press member includes a plate body, one end of the plate body is a press end, the other end of the plate body is a fixed end, a pivot is disposed between the press end and the fixed end in a manner that enables the plate body to be pivotally disposed on the first side plate.

2. The assembly structure for the server hard disk back panel of claim 1, wherein the press end includes a press portion bent horizontally, and a press hole cooperative with the press end is formed on a corresponding side edge of the back panel for the press portion to press on the press hole.

3. The assembly structure for the server hard disk back panel of claim 1, wherein the fixed end is disposed with a resilient pin, and the resilient pin includes a protruding pin insertedly disposed on the first side plate.

4. The assembly structure for the server hard disk back panel of claim 1, wherein each of the hard disk frame is in an inverse-U shape.

5. The assembly structure for the server hard disk back panel of claim 1, wherein a lower edge of each of the two side portions of each of the hard disk frames includes a plurality of flanges, and a plurality of engagement holes are formed corresponding thereto on the bottom plate of the server chassis, and the flange of each of the hard disk frames is engaged and positioned in the engagement hole of the bottom plate.

6. The assembly structure for the server hard disk back panel of claim 1, wherein a bend portion bent inwardly is disposed at a lower edge of each of the two side portions of each of the hard disk frames.

7. The assembly structure for the server hard disk back panel of claim 6, wherein each of the bend portions includes a plurality of upper screw holes, the bottom plate of the server chassis includes a plurality of corresponding lower screw holes, and the upper screw hole of each of the bend portions overlaps the corresponding lower screw hole for screw fastening.

8. The assembly structure for the server hard disk back panel of claim 1, wherein each of the hooks includes a bend edge bent inwardly from the side edge of the side portion and includes a hook plate extending from the bend edge toward the back panel, and the hook plate contacts against the contact edge of the hook hole and hooks on the hook edge of the hook hole.

\* \* \* \* \*